(12) United States Patent
Chauvet et al.

(10) Patent No.: US 9,030,055 B2
(45) Date of Patent: May 12, 2015

(54) ELECTRIC CIRCUIT CONFIGURATION FOR SWITCHING AN ELECTRICAL LOAD

(75) Inventors: Yannick Chauvet, Stuttgart (DE); Bernd Schelling, Stuttgart (DE); Patrick Bauer, Stuttgart (DE); Mehmet Oencel, Boennigheim (DE); Ralph Bauer, Esslingen (DE); Thomas Holst, Stuttgart (DE); Georg Hoegele, Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 657 days.

(21) Appl. No.: 13/498,242

(22) PCT Filed: Sep. 8, 2010

(86) PCT No.: PCT/EP2010/063157
§ 371 (c)(1),
(2), (4) Date: Jun. 11, 2012

(87) PCT Pub. No.: WO2011/036056
PCT Pub. Date: Mar. 31, 2011

(65) Prior Publication Data
US 2012/0242169 A1    Sep. 27, 2012

(30) Foreign Application Priority Data
Sep. 24, 2009 (DE) .......... 10 2009 044 950

(51) Int. Cl.
*F16K 31/06* (2006.01)
*H01F 7/18* (2006.01)
(Continued)

(52) U.S. Cl.
CPC ............. *F16K 31/0675* (2013.01); *G01R 1/203* (2013.01); *G01R 31/025* (2013.01); *H01F 7/1811* (2013.01); *H01F 7/1844* (2013.01); *H03K 17/082* (2013.01)

(58) Field of Classification Search
USPC .................................................. 307/125, 131
See application file for complete search history.

(56) References Cited

U.S. PATENT DOCUMENTS

| 4,300,508 A | 11/1981 | Streit et al. |
| 5,205,619 A | 4/1993 | Holst et al. |

(Continued)

FOREIGN PATENT DOCUMENTS

| CN | 101027823 | 8/2007 |
| CN | 201008141 | 1/2008 |

(Continued)

OTHER PUBLICATIONS

PCT/EP2010/063157 International Search Report dated Dec. 13, 2010 (Original and English Translation—8 pages).

*Primary Examiner* — Robert Deberadinis
(74) *Attorney, Agent, or Firm* — Michael Best & Friedrich LLP

(57) ABSTRACT

The invention relates to an electric circuit configuration for switching an electrical load (3), particularly a solenoid valve, by means of at least one switching means (5) associated with the consumer (3), particularly a transistor. The circuit configuration comprises at least one analysis circuit comprising at least one measuring resistor (17) connected in series with the switching means (5), at least one first analysis means (23) for determining a parameter corresponding to the short-circuit current, and at least one second analysis means (25) for determining a parameter corresponding to the consumer current. The circuit configuration is characterized in that the first analysis means (23) is connected in parallel with the measurement resistor (17).

9 Claims, 2 Drawing Sheets

(51) Int. Cl.
    *H03K 17/082* (2006.01)
    *H01H 47/00* (2006.01)
    *G01R 1/20* (2006.01)
    *G01R 31/02* (2006.01)

(56) References Cited

U.S. PATENT DOCUMENTS

| | | |
|---|---|---|
| 2004/0155121 A1 | 8/2004 | Watanabe et al. |
| 2004/0178782 A1 | 9/2004 | Yokoyama et al. |
| 2007/0030068 A1 | 2/2007 | Motonobu et al. |
| 2007/0288188 A1 | 12/2007 | Kahr et al. |
| 2008/0204084 A1 | 8/2008 | Terdan et al. |
| 2008/0284253 A1* | 11/2008 | Stenfert Kroese et al. ... 307/131 |

FOREIGN PATENT DOCUMENTS

| | | |
|---|---|---|
| DE | 3034726 | 4/1982 |
| DE | 4140586 | 1/1994 |
| DE | 102004028700 | 1/2006 |
| JP | 9329270 | 12/1997 |
| JP | 2006100509 | 4/2006 |
| JP | 2008061454 | 3/2008 |
| JP | 2009008207 | 1/2009 |

* cited by examiner

ELECTRIC CIRCUIT CONFIGURATION FOR SWITCHING AN ELECTRICAL LOAD

BACKGROUND OF THE INVENTION

The invention relates to an electric circuit configuration for switching an electrical load, in particular a solenoid valve, by means of a switching means associated with the load, in particular a transistor, wherein the circuit configuration has at least one analysis circuit. The analysis circuit comprises at least one measuring resistor connected in series with the switching means, at least one first analysis means for determining a parameter corresponding to the short-circuit current, and at least one second analysis means for determining a parameter corresponding to the load current.

Electric circuit configurations for switching an electrical load by means of a switching means associated with the load, in particular a transistor, and for detecting a short-circuit are known. The detection of the short circuit serves to open the switching means in the case of a short circuit, for example of the load, in order to prevent damage to the switching means due to too large a current. For this purpose, it is usual to determine a voltage drop across the switching means and to ascertain the short circuit based on this voltage drop. Particularly when a transistor is used as the switching means, the resistance which the transistor in itself forms in the closed state depends on its temperature. There is therefore no immediate relationship between the voltage drop across the switching means and a current which is described as a short-circuit current which flows in the event of a short circuit. On the other hand, it is also usual for the current which flows through the electrical load to be determined by means of an analysis circuit. The short circuit can also be detected based on the current determined in this way. Such an analysis circuit is designed for continuously determining a parameter corresponding to the current flowing through the load. The determination of whether a short circuit is present based on this parameter takes place in an evaluation device downstream of the analysis circuit. As a rule, such a circuit configuration with a multi-stage analysis circuit is too slow for detecting the short circuit and is therefore unable to open the switching means before it becomes damaged due to the short circuit.

SUMMARY OF THE INVENTION

In contrast with this, the electric circuit configuration has the advantage that a parameter corresponding to the short-circuit current is determined separately, independently of temperature and sufficiently quickly. For this purpose, the first analysis means is connected in parallel with the measuring resistor. The electric circuit configuration according to the invention therefore has at least one first analysis means which is designed and optimized for determining the parameter corresponding to the short-circuit current, and at least one second analysis means which is distinct from the first analysis means and is designed and optimized for determining the parameter corresponding to the load current. Short-circuit current is understood to mean that current which flows through the switching means when a certain voltage is applied in the event of a short circuit. Load current is understood to mean a current which flows through the electrical load in normal operation, that is to say not in the case of a short circuit. By providing two analysis means, which determine short-circuit and load current separately from one another, and by connecting the first analysis means in parallel with the measuring resistor, the two parameters are determined and evaluated independently and quickly. In doing so, it is not necessary to take into account any frame conditions, such as the temperature of a component for example. The load is a solenoid valve, for example, that is to say an inductive load.

An improvement of the invention provides that the second analysis means, which serves to determine the parameter corresponding to the load current, is connected in parallel with the measuring resistor. By connecting the second analysis means in parallel with the measuring resistor, short-circuit current and load current can be determined independently of one another using only a single measuring resistor. This measuring resistor can consist of a plurality of resistors which are combined with or connected to one another. By using two independent analysis means for determining the parameter corresponding to the short-circuit current and the parameter corresponding to the load current, these analysis means can be designed and optimized for the respective current ranges, enabling both parameters to be evaluated accurately.

An improvement of the invention provides that the analysis circuit has a further measuring resistor, with which the second analysis means is connected in parallel. In this circuit configuration, the measuring resistor with the first analysis means and the further measuring resistor with the second analysis means form the analysis circuit. In doing so, the measuring resistor and the first analysis means can be matched to one another, enabling the parameter corresponding to the short-circuit current or the short circuit to be determined. The further measuring resistor and the second analysis means can be matched to one another, enabling the parameter corresponding to the load current to be determined. By connecting an analysis means in parallel with a measuring resistor in each case, the parameters corresponding to the respective current can be determined from the voltage drop across the respective measuring resistor.

An improvement of the invention provides that the resistance of the measuring resistor is less than the resistance of the further measuring resistor. The measuring resistor which serves to determine the parameter corresponding to the short-circuit current can be considerably smaller than the resistance of the further measuring resistor which serves to determine the parameter corresponding to the load current. The measuring resistor therefore preferably has a low resistance compared with the further measuring resistor. In the event of a short circuit, a considerably higher current flows than in normal operation of the load. Therefore, a parameter corresponding to the short-circuit current can be determined sufficiently accurately with a considerably smaller resistor. Furthermore, this enables the voltage drop across the measuring resistor to be minimized, as a result of which the circuit requires less energy.

An improvement of the invention provides that the first analysis means has a comparator. The first analysis means, which serves to determine the parameter corresponding to the short-circuit current, must first and foremost be able to detect the short circuit quickly. A comparator is a particularly suitable analysis means for this purpose, as the comparator provides a result of a parameter comparison, for example of voltages, directly. It is therefore possible to compare the parameter corresponding to the short-circuit current directly with a specified parameter. The result of this comparison provides information as to whether a short circuit is present or not. The short circuit can therefore be determined directly based on the result of the comparator without using further analysis means. In this case, an actuating device of the switching means can be acted on directly by an output of the comparator.

An improvement of the invention provides that the second analysis means has an operational amplifier, in particular a differential amplifier. In contrast with the first analysis means, the second analysis means, which serves to determine the parameter corresponding to the load current, does not have to detect a particular state, namely the short circuit, but must determine—preferably continuously—a parameter corresponding to the load current. A differential amplifier is particularly suitable for this, as it is suitable for determining a parameter corresponding to the load current based on the voltage dropped across the resistor which is connected in parallel with the analysis means.

An improvement of the invention provides that the measuring resistor and the further measuring resistor are connected in series. This can be provided by means of a connecting wire. Such a direct series connection of the two measuring resistors enables a common heat dissipation, for example, to be realized for the two resistors.

An improvement of the invention provides that a common measuring lead branches off between the measuring resistor and the further measuring resistor and is connected to both the first and to the second analysis means. The branch is accordingly provided in the connecting wire. A common measuring lead which is connected to the first and to the second analysis means enables both analysis means to be connected to both measuring resistors with only three measuring leads. If the two analysis means are arranged together on a separate printed circuit board, for example, then this results in a simplification of the connection between this printed circuit board and the measuring resistors in that three instead of four measuring leads are required.

An improvement of the invention provides that the measuring resistor is connected by circuitry to a ground connection. By connecting the measuring resistor which serves to determine the parameter corresponding to the short-circuit current to ground, the voltage dropped across the short-circuit resistance can be evaluated relative to ground for example. Such an evaluation can be easily realized, particularly in combination with a comparator.

An improvement of the invention provides that the input measuring ranges of the first and second analysis means respectively are matched to the parameter corresponding to the short-circuit current and to the load current respectively. By matching the input measuring ranges, it is possible to measure both the parameter corresponding to the short-circuit current and that corresponding to the load current very accurately. This is particularly advantageous when the measuring resistor is not suitable or is only suitable to a limited extent for determining both the parameter corresponding to the short-circuit current and that corresponding to the load current without matching the input measuring ranges of the analysis means.

BRIEF DESCRIPTION OF THE DRAWINGS

The invention is explained below based on the embodiments shown in the drawing without these imposing a restriction on the invention. In the drawing.

DETAILED DESCRIPTION

Figure 1:
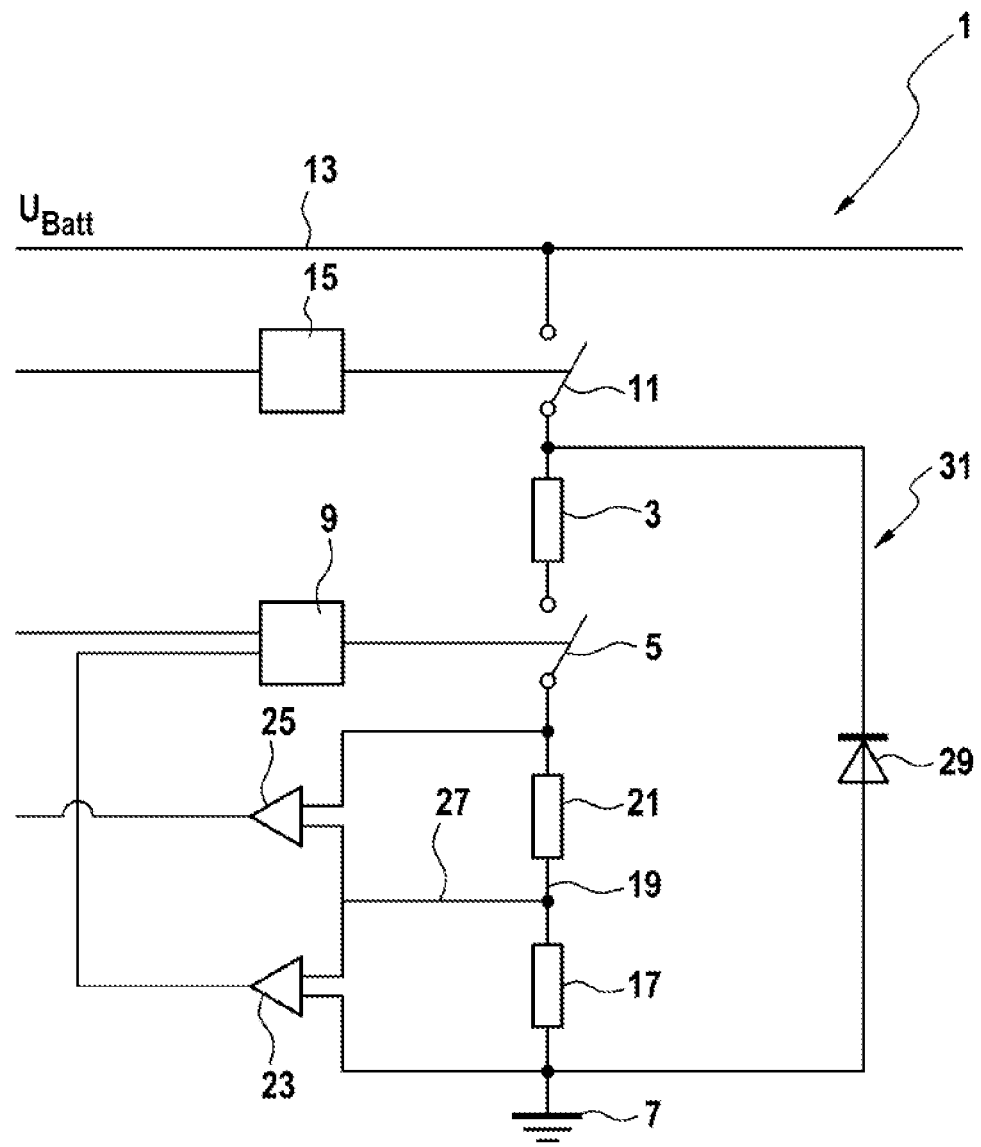
FIG. 1 shows a first exemplary embodiment of the circuit according to the invention.

FIG. 1 shows a first circuit configuration 1 with an electrical load 3 which is connected by means of circuitry on one side to a first switching means 5. A first actuating device 9 acts on the first switching means 5 in such a way that the switching means 5 can be opened and closed. On the other side, the load 3 is connected by means of circuitry to a voltage supply device 13 via a second switching means 11. The voltage supply device 13 provides a voltage $U_{Batt}$. A second actuating device 15 acts on the second switching means 11 in such a way that said switching means can be opened and closed. The electrical load 3 is switched on when both switching means 5 and 11 are closed. The load 3 is switched off as soon as one of the switching means 5 and 11 is opened.

A measuring resistor 17 is connected on one side by means of circuitry to a ground connection 7 and on the other side via a connecting wire 19 to a further measuring resistor 21. The further measuring resistor 21 is connected to the load 3 via the switching means 5. A first analysis means 23, which serves to determine a parameter corresponding to the short-circuit current, is connected in parallel with the measuring resistor 17. A second analysis means 25, which serves to determine a parameter corresponding to the load current, is connected in parallel with the further measuring resistor 21. Here, the short-circuit current corresponds to a current which flows through the switching means 5 and 11 in the event of a short circuit, for example of the load 3. The load current corresponds to the current which flows through the load 3 in normal operation thereof. The analysis means 23 and 25 are connected by means of a common measuring lead 27 to the connecting wire 19 of the measuring resistors 17 and 21. By way of example, the first analysis means 23 is connected by circuitry to the first actuating device 9 of the switching means 5 so that the first actuating device 9 can open the switching means 5 based on a signal of the first analysis means 23 which, for example, is output when a short circuit is detected by means of the analysis means 23. This provides a direct and fast short-circuit protection which, in the event of a short circuit, opens the switching means 5 independently of further parameters, such as a temperature of a component for example. This simultaneously protects the switching means 11, as no current can flow through the switching means 11 when the switching means 5 is open. By way of example, the second analysis means 25 can be connected to a control and/or regulator device (not shown here) which in turn can act on the actuating devices 9 and 15 of the switching means 5 and 11 or directly on the latter, as a result of which the opening and closing of the switching means 5 and/or 11 can be controlled and/or regulated in normal operation. For this purpose, a signal of the second analysis means 25, which corresponds to the characteristic of a parameter corresponding to the load current for example, is made available to the control and/or regulator device. In this way, the current can be controlled by pulsing the voltage, for example. In addition, it is possible to derive information relating to the load 3 based on the parameter corresponding to the load current. In the case where the determination of the parameter corresponding to the load current shows that no current is flowing through the load 3, it can be assumed from this, for example, that the load 3 is defective. Furthermore, it is possible, for example, to detect the opening or the opening time of a load 3 in the form of a solenoid valve by analyzing the characteristic of the parameter corresponding to the load current. In addition, the first circuit configuration 1 has a diode 29. Arranging the diode 29 in parallel with the load 3 and the measuring resistors 17 and 21 produces a free-wheel circuit 31, which, for example, protects the electrical load 3 against damage when said load has inductive properties.

Figure 2:
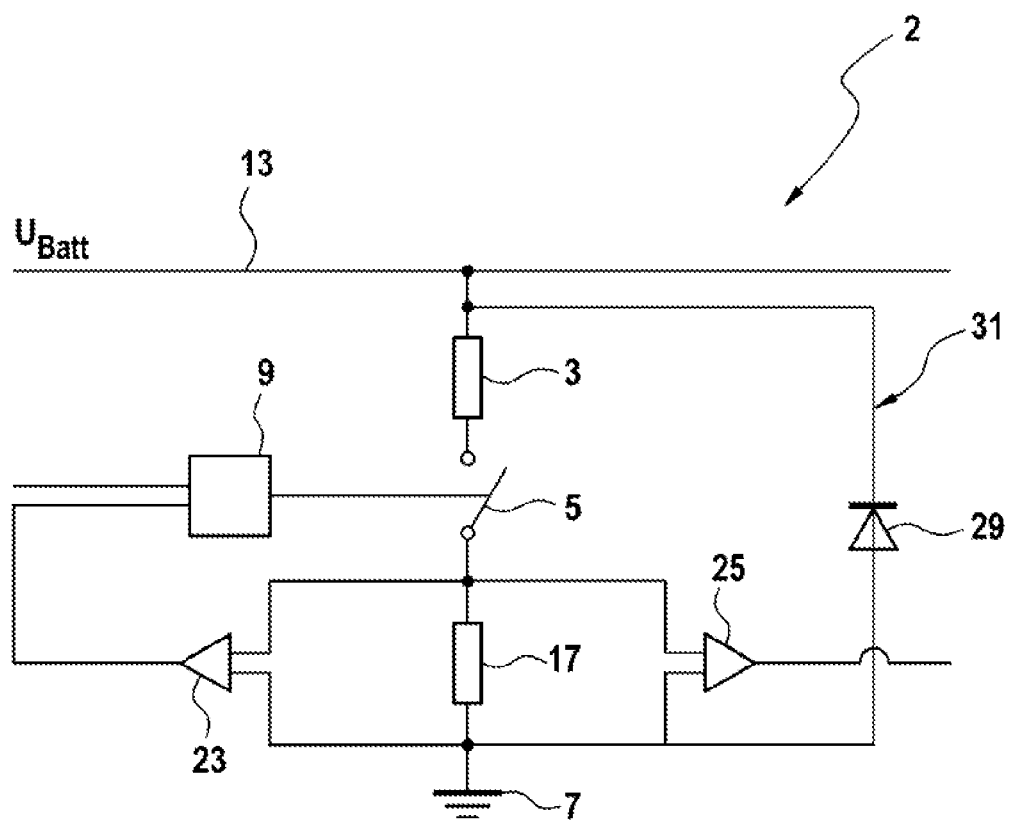
FIG. 2 shows a further exemplary embodiment of the circuit according to the invention.

FIG. 2 shows a second circuit configuration 2 of the circuit configuration 1 according to the invention. Elements which correspond to the elements of FIG. 1 are given the same reference numbers. FIG. 2 likewise has the electrical load 3 which, from the circuit point of view, is arranged between the voltage supply device 13 and the first switching means 5. The first actuating device 9 acts on the switching means 5 so that the switching means 5 can be opened and closed. Further, the measuring resistor 17 is connected in series with the load 3. The measuring resistor 17 is also connected to the ground connection 7. The first analysis means 23 is connected in parallel with the measuring resistor 17. The second analysis means 25 is distinct from the first analysis means 23 but is likewise connected in parallel with the measuring resistor 17. The first analysis means 23, which serves to determine a parameter corresponding to the short-circuit current, acts on the first actuating device 9 in such a way that, in the event of a short circuit, in particular when the load 3 has a short circuit, it opens the switching means 5 so that this is not damaged by the current which flows in the event of a short circuit. In addition, a control and/or regulator device (not shown here) can act on the first actuating device 9, which control and/or regulator device opens or closes the switching means 5 via the first actuating device 9 in normal operation of the circuit configuration 2. The second analysis means 25, which serves to determine a parameter corresponding to the load current, can likewise be connected to the control and/or regulator device. This control and/or regulator device therefore receives a signal which corresponds to the characteristic of the parameter corresponding to the load current. The normal operation of the load 3 can be controlled and/or regulated if necessary based on the switching means 5 by means of this signal. Separating the determination of the parameters corresponding to the short-circuit current and to the load current enables load current and short-circuit current to be determined independently of one another. For this purpose, it can be provided that the input measuring ranges of the first analysis means 23 and of the second analysis means 25 are in each case matched to the parameter corresponding to the short-circuit current and to the load current respectively, in particular when the measuring resistor 17 does not allow the two parameters to be determined sufficiently accurately or sufficiently quickly.

The invention claimed is:

1. An electric circuit configuration for switching an electrical load (3), by means of at least one switch (5) associated with the load (3), wherein the circuit configuration has at least one analysis circuit having at least one measuring resistor (17) connected in series with the switch (5), at least one first analysis element (23) for determining a parameter corresponding to the short-circuit current, and at least one second analysis element (25) for determining a parameter corresponding to the load current, wherein the first analysis element (23) is connected in parallel with the measuring resistor (17) and the analysis circuit has a further measuring resistor (21), with which the second analysis element (25) is connected in parallel, wherein the resistance of the measuring resistor (17) is less than the resistance of the further measuring resistor (21), and wherein the measuring resistor and the further measuring resistor (17, 21) are connected in series.

2. The electric circuit configuration as claimed in claim 1, characterized in that the first analysis element (23) has a comparator.

3. The electric circuit configuration as claimed in claim 1, characterized in that the second analysis element (25) has a an operational amplifier.

4. The electric circuit configuration as claimed in claim 1, characterized in that a common measuring lead (27) branches off between the measuring resistor and the further measuring resistor (17, 21) and is connected to both the first and to the second analysis element (23, 25).

5. The electric circuit configuration as claimed in claim 1, characterized in that the measuring resistor (17) is connected by circuitry to a ground connection (7).

6. The electric circuit configuration as claimed in claim 1, characterized in that the input measuring ranges of the first and second analysis element (23, 25) respectively are matched to a parameter corresponding to the short-circuit current and to the load current respectively.

7. The electric circuit configuration as claimed in claim 1, characterized in that the electrical load is a solenoid valve.

8. The electric circuit configuration as claimed in claim 1, characterized in that the switch is a transistor.

9. The electric circuit configuration as claimed in claim 1, characterized in that the second analysis element has a differential amplifier.

* * * * *